(12) United States Patent
Hiraoka et al.

(10) Patent No.: US 6,791,124 B2
(45) Date of Patent: Sep. 14, 2004

(54) SEQUENTIAL MESA AVALANCHE PHOTODIODE CAPABLE OF REALIZING HIGH SENSITIZATION AND METHOD OF MANUFACTURING THE SAME

(75) Inventors: Jun Hiraoka, Atsugi (JP); Kazuo Mizuno, Zama (JP); Yuichi Sasaki, Atsugi (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 10/238,362

(22) Filed: Sep. 9, 2002

(65) Prior Publication Data

US 2003/0052390 A1 Mar. 20, 2003

(30) Foreign Application Priority Data

Sep. 18, 2001 (JP) ......................... 2001-284039
Jul. 26, 2002 (JP) ......................... 2002-218311

(51) Int. Cl.[7] ......................... H01L 31/0328
(52) U.S. Cl. ............... 257/186; 257/184; 257/438; 257/452; 257/463; 257/466
(58) Field of Search ................. 257/184, 186, 257/431, 438, 447, 452, 460, 463, 466

(56) References Cited

U.S. PATENT DOCUMENTS 5,539,221 A * 7/1996 Tsuji et al. ............ 257/186
5,654,578 A * 8/1997 Watanabe ............ 257/438
5,937,274 A * 8/1999 Kondow et al. ............ 438/47
6,635,908 B2 * 10/2003 Tanaka et al. ............ 257/186

* cited by examiner

Primary Examiner—George Eckert
(74) Attorney, Agent, or Firm—Frishauf, Holtz, Goodman & Chick, P.C.

(57) ABSTRACT

A sequential mesa type avalanche photodiode (APD) comprises a semiconductor substrate and a sequential mesa portion formed on the substrate. In the sequential mesa portion, a plurality of semiconductor layers, including a light absorbing layer and a multiplying layer, are laminated by epitaxial growth. In the plurality of semiconductor layers, a pair of semiconductor layers forming a pn junction is included. The carrier density of a semiconductor layer which is near to the substrate among the pair of semiconductor layers is larger than the carrier density of a semiconductor layer which is far from the substrate among the pair of semiconductor layers. In the APD, light-receiving current based on movement of electrons and positive holes generated in the sequential mesa portion when light is incident from the substrate toward the light absorbing layer is larger at a central portion than at a peripheral portion of the sequential mesa portion.

7 Claims, 7 Drawing Sheets

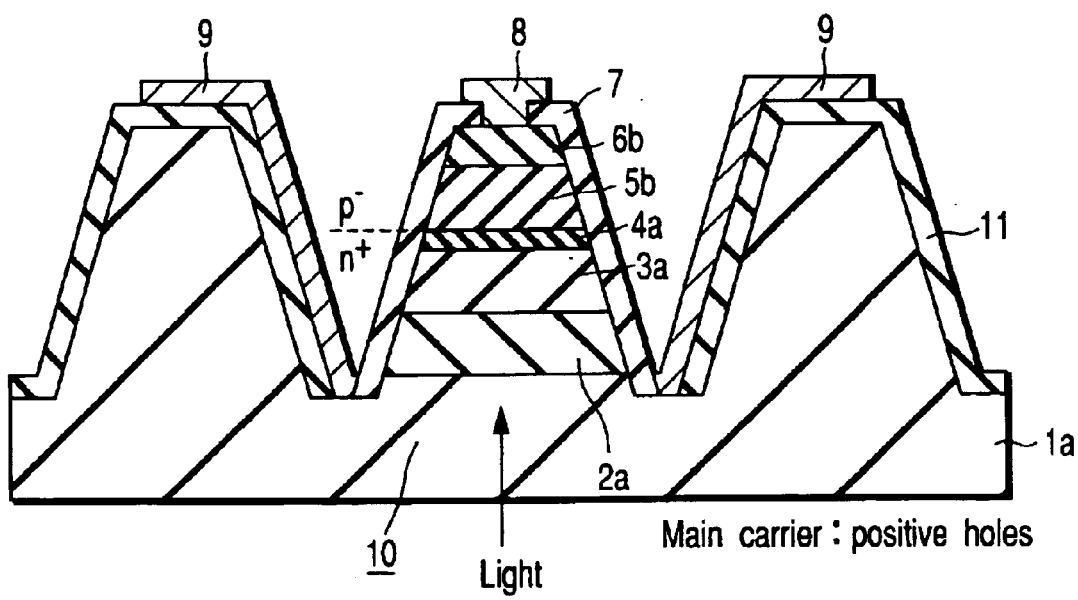
F I G. 1A
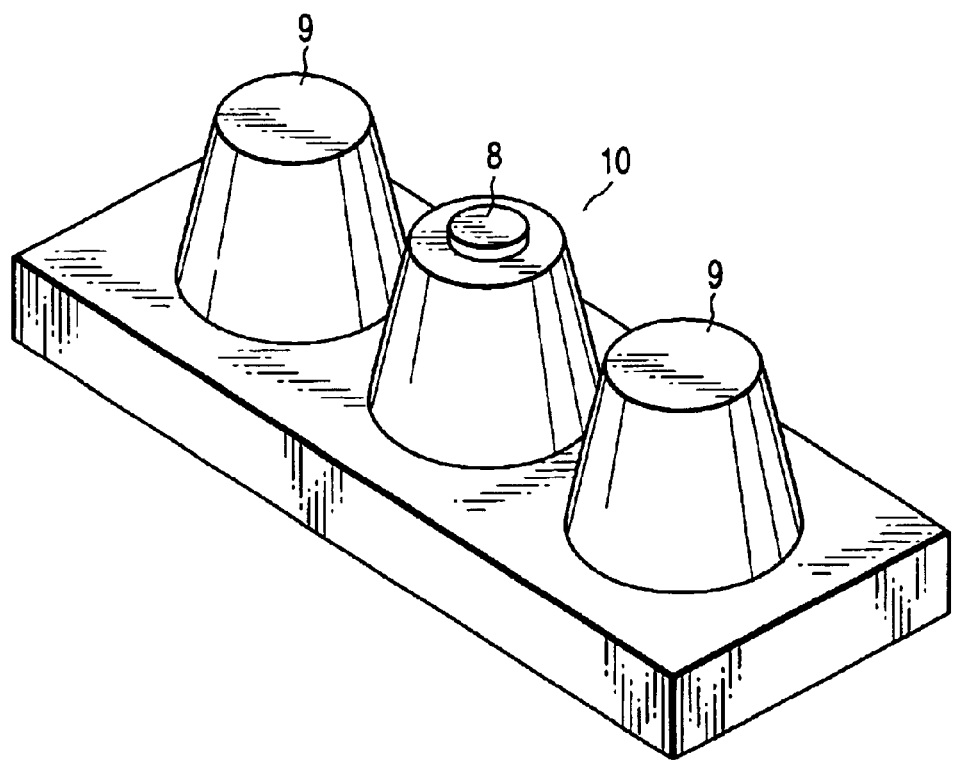
F I G. 1B

SEQUENTIAL MESA AVALANCHE PHOTODIODE CAPABLE OF REALIZING HIGH SENSITIZATION AND METHOD OF MANUFACTURING THE SAME

CROSS-REFERENCE TO RELATED APPLICATIONS

This application is based upon and claims the benefit of priority from the prior Japanese Patent Applications No. 2001-284039, filed Sep. 18, 2001; and No. 2002-218311, filed Jul. 26, 2002, the entire contents of both of which are incorporated herein by reference.

BACKGROUND OF THE INVENTION

1. Field of the Invention

The present invention relates to a sequential mesa avalanche photodiode and a method of manufacturing the same, and in particular, to a sequential mesa avalanche photodiode having a sequential mesa structure in which, in an avalanche photodiode to be used as a light receiving element for converting a light signal to an electric signal in an optical communication network or the like, high sensitization can be realized and the fabrication costs of modularization can be greatly decreased, and to a method of manufacturing the same.

2. Description of the Related Art

As is well-known, recently, the signal speed of light signals used in optical communication networks has been made much more high-speed.

In accordance therewith, making the speed more high-speed has been required of light receiving elements built in optical communication equipment transmitting and receiving such light signals.

Further, in such light receiving elements, it is required that even low level light signals can be precisely received.

As such a light receiving element receiving high-speed and weak light signals, generally, an avalanche photodiode (hereinafter, abbreviated APD) has been put into practice.

In such an APD, in a state in which a depletion region is formed by applying reverse-bias voltage to a pn junction formed by a pair of semiconductor layers whose conductive types are different from one another, when an electromagnetic wave of a light signal or the like is incident from the exterior, a pair of an electron and a positive hole is generated.

Further, this pair of the electron and the positive hole is multiplied by the avalanche phenomenon in the APD, and taken out as voltage or electric current to the exterior.

There are various ways of classifying APDs. When classifying structurally, there are a planar type and a mesa type, and when classifying by main carrier, there are a positive hole type and an electron type.

Here, a sequential mesa structure used regardless of the type of the main carrier will be described.

Generally, in order to aim for making the APD high-speed, the mesa type, not the planar type, is generally used as the shape of the APD.

This is for decreasing the electric capacity of the APD element itself in order to make the APD high-speed.

In order to increase the permissible light-receiving current as an APD element, there is the need to remove the bias of the light-receiving current density flowing through the interior of the mesa portion.

Therefore, in a mesa type APD element, the shape of the mesa must be made to be isotropic, namely, as shown in FIG. 9B, formed conically as viewed from the top surface of a substrate.

Moreover, in a mesa type APD element, when the shape of the mesa is formed to be conical, attention must be paid such that the crystallinity of the cross-section of the mesa is not damaged.

Therefore, in a mesa type APD element, when the shape of the mesa is fabricated, diffusive wet-etching by an etchant which is not anisotropic is necessary.

By applying this diffusive wet-etching, the sequential mesa shape, which is a shape (generally, conical) in which the mesa diameter (cross-sectional area) widens as it approaches the substrate, can be obtained.

Accordingly, the sequential mesa type APD is generally used for making the APD high-speed.

Further, as APDs using positive holes as the main carrier, there are an APD in which the above-described pn junction is formed by epitaxial growth, and an APD in which the pn junction is formed by Zn diffusion.

FIGS. 9A and 9B respectively show a cross-sectional view and an external perspective view of a sequential mesa type APD, in accordance with a prior art, which has a sequential mesa structure and in which positive holes are used as the main carrier and the pn junction is formed by epitaxial growth.

Hereinafter, on the basis of FIGS. 9A and 9B, the structure of the sequential mesa type APD according to the prior art will be described.

Namely, in the sequential mesa type APD according to the prior art, as shown in FIGS. 9A and 9B, an n-type buffer layer $2a$, an n-type light absorbing layer $3a$, an n-type electric field relaxation layer $4a$, an n-type multiplying layer $5a$, and a p-type contact layer $6b$ are successively formed by epitaxial growth by using an MOVPE (organometallic vapor phase epitaxial growth) method on an n-type semiconductor substrate $1a$. Therefore, a conical sequential mesa portion 10 is formed by wet-etching from above.

Next, after a protective layer 7 is coated on the sequential mesa portion 10, a p electrode 8 contacting the p-type contact layer $6b$ is formed.

Further, at the both sides of the sequential mesa portion 10, an n electrode 9 is attached, via a protective layer 11, to another mesa portion formed for attaching electrodes.

As shown by the arrow in FIG. 9A, light incident on the APD from the bottom surface of the semiconductor substrate $1a$ penetrates through the semiconductor substrate $1a$ and the buffer layer $2a$ and is absorbed at the light absorbing layer $3a$, so that a pair of an electron and a positive hole is generated.

Among the pair of the electron and the positive hole generated in this way, the electron moves to the n electrode 9 via the semiconductor substrate $1a$, and the positive hole is multiplied at the multiplying layer $5a$, and moves to the p electrode 8 via the contact layer $6b$.

In order to make the positive hole be the main carrier among the pair of the electron and the positive hole, a great number of the carriers of the light absorbing layer $3a$ must be electrons.

Namely, the conductive type of the light absorbing layer $3a$ must be n type.

Such a sequential mesa type APD uses a so-called SAM (Separate Absorption and Multiplication) structure, in which the multiplying layer 5a and the light absorbing layer 3a are separated by the electric field relaxation layer 4a such that a low electric field intensity is applied to the light absorbing layer 3a while a high electric field intensity is applied to the multiplying layer 5a.

In this case, because the electric field intensity of the n-type light absorbing layer 3a is suppressed by the electric field relaxation layer 4a, the conductive type of the electric field relaxation layer 4a is the same n type as that of the light absorbing layer 3a.

Because such a sequential mesa type APD has a function avalanche-multiplying the light exciting carrier, the crystallinity of the above-described layers is considered to be extremely important.

Note that, in such a sequential mesa type APD, the epitaxial growth itself of each layer can be carried out, in theory, on a semiconductor substrate which is any of an n-type semiconductor substrate, a p-type semiconductor substrate, or a semi-isolated semiconductor substrate.

As described above, in the sequential mesa type APD, when considering the fact that light-receiving current flows via the semiconductor substrate, the semiconductor substrate which is used must be an n-type or a p-type semiconductor substrate.

However, as shown in FIGS. 9A and 9B, because a dopant such as Sn, S or the like included in the semiconductor substrate 1a does not diffuse during the epitaxial growth, the n-type semiconductor substrate 1a is suitable as a substrate for the epitaxial growth of each semiconductor layer.

On the other hand, in the p-type semiconductor substrate, there are problems such as the Zn included in the semiconductor substrate diffuses during the epitaxial growth, there is the need to form a thicker buffer layer by epitaxial growth in order to prevent the Zn from diffusing, and because the n-type semiconductor substrate layer is formed by epitaxial growth after the p-type semiconductor substrate is formed by epitaxial growth, the time after the epitaxial growth of the p-type semiconductor layer becomes longer. Thus, diffusion of the Zn which is the dopant in the p-type semiconductor layer formed by the epitaxial growth easily arises.

Namely, the p-type semiconductor substrate having such problems is not generally suitable for a sequential mesa type APD in which crystallinity is considered to be extremely important.

Accordingly, it is preferable that the n-type semiconductor substrate 1a is used as the sequential mesa type APD in order to epitaxially grow a semiconductor layer having good quality crystallinity.

In this way, in order to obtain a good light-receiving characteristic in a sequential mesa type APD in which the positive holes are the main carrier and the pn junction is formed by epitaxial growth, the n-type light absorbing layer 3a and the n type field relaxation layer 4a are necessary, and the semiconductor substrate which is used is preferably the n-type semiconductor substrate 1a.

Further, as described above, in a sequential mesa type APD in which the positive holes are the main carrier and the pn junction is formed by the epitaxial growth, as shown in FIGS. 9A and 9B, the p-type contact layer 6b is used in order to ensure an ohmic electrode in the p electrode 8.

At the time of epitaxial growth of the contact layer 6b, the contact layer 6b is doped to p type by using a p-type dopant such as Zn or the like.

Note that, in order to obtain the ohmic electrode, the p-type carrier density of the contact layer 6b is preferably set to be as high as possible, for example, about $5 \times 10^{18}$ (cm$^{-3}$) or more.

Note that the above-described MOVPE method or the like is mainly used as a growth method (manufacturing method) of the contact layer 6b.

Further, due to the Zn which is the dopant of the contact layer 6b being diffused in the n-type electric field relaxation layer 4a, the conductive type of the multiplying layer 5a is made to be n type so that the appropriate internal electric field intensity distribution in the direction perpendicular to the n-type semiconductor substrate 1a is not destroyed.

Accordingly, the pn junction in the sequential mesa type APD is formed by the p-type contact layer 6b and the n-type multiplying layer 5a.

Note that, in this case, the carrier density of the p-type contact layer 6b is particularly high as compared with the carrier density of the n-type multiplying layer 5a.

Therefore, it is ideal that the sequential mesa type APD, in which the positive holes are used as the main carrier and the pn junction is formed by epitaxial growth, has the structure shown in FIGS. 9A and 9B.

Namely, because the sequential mesa type APD basically does not use a Zn diffusing process to be described later, there is the advantage that the manufacturing process (the process steps) can be simplified.

Further, because the sequential mesa type APD uses an n-type semiconductor in the electric field relaxation layer 4a which is difficult to be manufactured by a p-type semiconductor, there is the advantage that MOVPE, which can epitaxially grow at the wafer a semiconductor layer having high crystallinity, can be used as the method of manufacturing the sequential mesa type APD.

Next, a sequential mesa type APD, which has a sequential mesa structure and in which positive holes are used as the main carrier and the pn junction is formed by Zn diffusion, will be described.

The structure itself of such a sequential mesa type APD is the same as the structure of the sequential mesa type APD shown in FIGS. 9A and 9B.

As described above, in order to acquire excellent characteristics at the sequential mesa type APD in which the positive holes are the main carrier, the n-type light absorbing layer 3a and the n-type electric field relaxation layer 4a are necessary, and it is preferable to use the n-type semiconductor substrate 1a. This is also true in the case of a sequential mesa type APD in which the pn junction is formed by Zn diffusion, and in the case of the above-described sequential mesa type APD, in which the pn junction is formed by epitaxial growth.

Further, the contact layer 6b is made to be p type by diffusing Zn therein by a Zn diffusion method in order to ensure an ohmic electrode in the p electrode 8.

Note that, in order to obtain the ohmic electrode, the p-type carrier density of the contact layer 6b is preferably set to be as high as possible, for example, about $5 \times 10^{18}$ (cm$^{-3}$) or more.

Further, in the Zn diffusing method, by heating the Zn raw material and the wafer contained in a container filled with an inert gas atmosphere, the Zn is diffused from the surface of the wafer to the interior of the wafer.

At this time, in order to carry out sufficient Zn diffusion, there is the need to control the gas pressure of the inert gas atmosphere so as to maintain a relatively high value by using an exclusively-used controller, and there is the problem that the manufacturing process (process steps) is complicated.

The Zn diffused in this way remains in the contact layer 6b, and the p-type carrier density is enhanced to a degree at which an ohmic electrode can be obtained, for example, to $5 \times 10^{18}$ (cm$^{-3}$) or more.

Note that, at this time, because the Zn is not diffused in the multiplying layer 5a, the conductive type of the multiplying layer 5a is maintained as n type.

In accordance therewith, the pn junction is formed by the p-type contact layer 6b, in which the p-type carrier density is increased by Zn diffusion, and the n-type multiplying layer 5a.

As a result, also in the case of a sequential mesa type APD in which positive holes are used the main carrier and the pn junction is formed by Zn diffusion, the structure shown in FIGS. 9A and 9B is ideal.

Further, the sequential mesa type APD in which the pn junction is formed by Zn diffusion has the advantage that the desired pn junction can be formed by appropriately setting the diffusing conditions of the Zn.

Further, the sequential mesa type APD in which the pn junction is formed by Zn diffusion also has the advantage that, because an n-type semiconductor is used as the electric field relaxation layer 4a which is difficult to fabricate by a p-type semiconductor, the MOVPE method, by which a highly crystalline semiconductor layer can be epitaxially grown on the wafer, can be used as the manufacturing method.

On the other hand, because the sequential mesa type APD uses a Zn diffusing process, the sequential mesa type APD has the drawback that the manufacturing process (process steps) is complicated due to the above-described reasons.

Next, the sequential mesa type APD, which has a sequential mesa structure and in which electrons are used as the main carrier and the pn junction is formed by epitaxial growth, will be described.

FIG. 10 shows a cross-sectional view of the sequential mesa type APD which has a sequential mesa structure and in which electrons are used as the main carrier and the pn junction is formed by epitaxial growth.

Note that, in this FIG. 10, portions which are the same as those of the sequential mesa type APD shown in FIG. 9A are denoted by the same reference numerals.

Further, an external perspective view of the sequential mesa type APD, which is shown in FIG. 10 and in which electrons are used as the main carrier and the pn junction is formed by epitaxial growth, is the same as in FIG. 9B, and thus, illustration is omitted.

Namely, as shown in FIG. 10, in the sequential mesa type APD in which electrons are used as the main carrier and the pn junction is formed by epitaxial growth, after the n-type buffer layer 2a, the n-type multiplying layer 5a, the p-type electric field relaxation layer 4b, the p type light absorbing layer 3b, a p-type window layer 13b, and the p-type contact layer 6b are successively formed by epitaxial growth on the n-type semiconductor substrate 1a by using an epitaxial growth method, the conical sequential mesa portion 10 is formed by wet-etching from above.

Further, after the protective layer 7 is coated on the sequential mesa portion 10, the p electrode 8 contacting the p-type contact layer 6b is formed.

Further, on the both sides of the sequential mesa portion 10, the n electrodes 9 are attached, via the protective layer 11, to another mesa portion formed for attaching electrodes.

In such a sequential mesa type APD in which electrons are the main carrier, as shown by the arrow in FIG. 10, light incident from the bottom surface of the semiconductor substrate 1a penetrates through the semiconductor substrate 1a, the buffer layer 2a, the multiplying layer 5a, and the electric field relaxation layer 4b and is absorbed at the light absorbing layer 3b, so that a pair of an electron and a positive hole is generated.

Among the pair of the electron and the positive hole generated in this way, the electron is multiplied at the multiplying layer 5a and moves to the n electrode 9 via the n-type semiconductor substrate 1a, and the positive hole moves to the p electrode 8 via the contact layer 6b.

In order to make the electron be the main carrier among the pair of the electron and the positive hole, a great number of carriers of the light absorbing layer 3b must be positive holes.

Namely, in this case, the conductive type of the light absorbing layer 3b must be p type.

In such a sequential mesa type APD in which electrons are the main carrier, the above-described SAM structure, in which the multiplying layer 5a and the light absorbing layer 3b are separated by the electric field relaxation layer 4b such that a low electric field intensity is applied to the light absorbing layer 3b while a high electric field intensity is applied to the multiplying layer 5a, is used.

In this case, because the electric field intensity of the p type light absorbing layer 3b is suppressed by the electric field relaxation layer 4b, the conductive type of the electric field relaxation layer 4b is p type which is the same as that of the light absorbing layer 3b.

Further, because such a sequential mesa type APD in which electrons are the main carrier has a function avalanche-multiplying the light exciting carrier, the crystallinity of the above-described layers is considered to be extremely important.

In order to obtain excellent crystallinity of each semiconductor layer, for the same reasons as in the case of the sequential mesa type APD described in FIGS. 9A and 9B in which positive holes are the main carrier, the semiconductor substrate which is used is preferably the n-type semiconductor substrate 1a.

Moreover, in order to improve the accuracy of the electric field intensity distribution in the sequential mesa portion 10 in the direction perpendicular to the semiconductor substrate 1a, because the pn junction is preferably formed between the p-type electric field relaxation layer 4b and the multiplying layer 5a, the multiplying layer 5a is n type.

Such a formed position of the pn junction is also preferable for making estimation of the amount of decrease in the electric field intensity in the multiplying layer 5a be unnecessary.

Accordingly, in the sequential mesa type APD in which electrons are the main carrier, the pn junction is formed by the p-type electric field relaxation layer 4b and the multiplying layer 5a.

In this way, in order to obtain excellent light-receiving characteristics in a sequential mesa type APD in which the electrons are the main carrier and the pn junction is formed by epitaxial growth, the p type light absorbing layer 3b, the p-type electric field relaxation layer 4b, and the n-type multiplying layer 5a are necessary, and the semiconductor substrate which is used is preferably the n-type semiconductor substrate 1a.

In such a sequential mesa-type APD, the window layer 13b also is necessary in order to prevent the electrons which are a light exciting carrier from diffusing/moving to the contact layer 6b.

Note that GS-MBE (gas-molecule beam epitaxy), MBE (molecule beam epitaxy), and the like are mainly used as the epitaxial growth method.

Further, in order to ensure the ohmic electrode of the p electrode 8, the conductive type of the contact layer 6b is p type.

Moreover, at the time of epitaxial growth, the contact layer 6b is doped to a p type by using a p-type dopant such as Be or the like.

Note that, in order to obtain the ohmic electrode, the p-type carrier density of the contact layer 6b is preferably set to be as high as possible, for example, about $5 \times 10^{18}$ (cm$^{-3}$) or more.

Accordingly, in a sequential mesa type APD in which electrons are the main carrier, the structure shown in FIG. 10 is ideal, and because electrons having a light effective mass are the main carrier, there is the feature that it is advantageous with respect to the point of high-speed performance.

However, in the APDs having the sequential mesa structures shown in FIGS. 9A, 9B and FIG. 10, there are still the following problems which must be improved.

Firstly, in the sequential mesa type APD in which positive holes are the main carrier, or also in the sequential mesa type APD in which electrons are the main carrier, there is the problem that, in each semiconductor layer forming the sequential mesa portion 10, except for the case of selectively diffusing Zn at a specific portion in the surface parallel to the semiconductor substrate, it is difficult for the in-surface distribution of electric field intensity in a surface parallel to the semiconductor substrate to concentrate at the central portion of the mesa by only the epitaxial growth process.

FIG. 3 shows measured results of the light-receiving sensitivity distribution characteristic of a sequential mesa type APD whose light-receiving diameter is 40 μm.

Concretely, FIG. 3 shows measured values of light-receiving current (μA) obtained between the p electrode 6 and the n electrode 9 at each position (μm) in a case in which the irradiating position of an extremely thin light beam is successively moved within the aforementioned range of 40 μm.

In FIG. 3, characteristic B shows the light-receiving sensitivity distribution characteristic of the sequential mesa type APD as shown in FIGS. 9A and 9B.

As illustrated, characteristic B is a double-peaked characteristic in which the light-receiving current at the peripheral portion of the mesa shown by the positions −20 μm, +20 μm from the central position (0) is larger than the light-receiving current at the central portion of the mesa.

A sequential mesa type APD whose light-receiving characteristic is a double-peaked characteristic in this way has the problem that it is difficult to align the optical axes at the time of actual use when made into a module, and the yield of the modularization deteriorates. Because alignment of the optical axes must be carried out at the central portion of the mesa at which the light-receiving current is smaller than that of the peripheral portion of the mesa, a sufficient light-receiving characteristic cannot be exhibited. In addition, it is difficult to realize high sensitization by keeping to a minimum the effects of the dark current and noise contained in the light-receiving signal relating to the problem of crystallinity described later, and to decrease the fabricating costs of modularization.

Hereinafter, reasons why these problems arise will be described.

Because the APD shown in FIGS. 9A and 9B is a sequential mesa type structure, the more the electric field intensity increases, the more the carrier of the positive holes or the electrons is multiplied.

Accordingly, the magnitude of the light-receiving current shows the magnitude of the electric field intensity at the pn junction.

It can be said that the electric field intensity at the periphery of the mesa is higher and the electric field intensity at the central portion of the mesa is low in the sequential mesa type APD shown in FIGS. 9A and 9B.

FIG. 11 shows the way of broadening (width) of the depletion region (depletion layer) by built-in potential from the pn junction in the sequential mesa type APD shown in FIGS. 9A and 9B in which positive holes are used as the main carrier.

Note that, as described above, because the carrier density of the p-type contact layer 6b forming the pn junction is higher than the carrier density of the multiplying layer 5a, the majority of the depletion region (depletion layer) is formed at the semiconductor substrate 1a side of the pn junction.

As shown in FIG. 11, because this APD has a sequential mesa structure, the ratio of the cross-sectional area showing the depletion region of the p-type contact layer 6b structuring the pn junction and the cross-sectional area showing the depletion region of the n-type multiplying layer 5a greatly differs at the central portion of the mesa and at the peripheral portion of the mesa.

Here, considering from the standpoint of depleting the pn junction portion, because the APD has a sequential mesa structure, at the vicinity of the periphery of the mesa, there is a state in which the carrier density of the multiplying layer 5a is substantially higher than at the central portion of the mesa.

In contrast, at the contact layer 6b, conversely, there is a state in which the carrier density is weak. However, because the carrier density is originally high at the contact layer 6b, even if it is in a state in which the carrier density is substantially weak, the effect is small.

As a result, in the sequential mesa type APD, the way of broadening (width) of the depletion region is shorter (narrower) than the way of broadening (width) of the central portion.

Namely, it can be understood that the electric field intensity at the peripheral portion of the mesa is higher than that at the central portion of the mesa in the sequential mesa type APD.

FIG. 12 shows the way of broadening (width) of the depletion region (depletion layer) by built-in potential from the pn junction portion in the sequential mesa type APD as shown in FIG. 10 in which electrons are used as the main carrier.

In this sequential mesa type APD, the carrier density of the p-type electric field relaxation layer 4b forming the pn junction is higher than the carrier density of the multiplying layer 5a. Thus, as shown in FIG. 12, in accordance with the principles of charge neutrality, the way of broadening (width) of the depletion region at the vicinity of the periphery of the mesa is shorter (narrower) than the way of broadening (width) of the central portion.

Namely, in the sequential mesa type APD, the electric field intensity at the peripheral portion of the mesa is higher than that at the central portion of the mesa.

The reason for this is that, in the sequential mesa type APD, it is difficult for the in-surface distribution of field intensity in a surface parallel to the semiconductor substrate to concentrate at the central portion of the mesa by only the epitaxial growth process, so that there is a double-peaked characteristic in which the light-receiving current at the peripheral portion of the mesa is greater than the light-receiving current at the central portion of the mesa.

In this way, in the sequential mesa type APD in which positive holes or electrons are used as the main carrier and the pn junction is formed by epitaxial growth, the way of broadening (width) of the depletion region at the vicinity of the periphery of the mesa is shorter (narrower) that at the central portion, and the electric field intensity at the peripheral portion of the mesa is higher than at the central portion of the mesa.

Here, the relationship between the crystallinity and the light-receiving characteristic of the sequential mesa type APD will be described.

As described above, a sequential mesa type APD of this type, the light-receiving current is multiplied by an avalanche multiplying function.

Further, the noise at the time of the avalanche multiplying function greatly depends on the crystallinity of the sequential mesa type APD.

Accordingly, even among light-receiving elements in which crystallinity is considered to be important, in particular, the crystallinity of a sequential mesa type APD is important.

In a sequential mesa type APD, a mesa side surface 10a formed by mesa-etching is provided at the peripheral portion of the mesa of a sequential mesa portion 10.

Generally, the mesa side surface 10a has a great number of crystal defects as compared with the interior portion of the mesa.

Further, the crystal defects adversely affect the consideration of solutions for decreasing dark current in the sequential mesa type APD, decreasing noise, high sensitization, and modularization.

Namely, in a sequential mesa type APD in which positive holes or electrons are used as the main carrier and the pn junction is formed by epitaxial growth, as shown by characteristic B of FIG. 3, when the light-receiving characteristic of the sequential mesa type APD is dominant at the peripheral portion of the mesa, the good crystallinity which the central portion of the mesa has is not reflected in the light-receiving characteristic of the entire sequential mesa type APD. As a result, it is a cause for the light-receiving characteristic of the entire sequential mesa type APD to deteriorate, and for it to be difficult to align optical axes at the time of making the APD a module, and for the yield of modularization to be poor, and for the fabricating costs of modularization to increase.

BRIEF SUMMARY OF THE INVENTION

An object of the present invention is to provide a sequential mesa type avalanche photodiode which is achieved on the basis of the above-described circumstances, and in which, in a sequential mesa type APD in which positive holes or electrons are used as the main carrier and a pn junction is formed by epitaxial growth, by making the distribution of the electric field concentrate at the central portion of the mesa, the effects of dark current and noise contained in a light-receiving signal can be kept to a minimum, and high sensitization can be realized, and the fabricating costs at the time of modularization of the APD can be greatly decreased.

Another object of the present invention is to provide a method of manufacturing a sequential mesa type avalanche photodiode which is achieved on the basis of the above-described circumstances, and in which, in a sequential mesa type APD in which positive holes or electrons are used as the main carrier and a pn junction is formed by epitaxial growth, by making the distribution of the electric field concentrate at the central portion of the mesa, the effects of the dark current and noise contained in a light-receiving signal can be kept to a minimum, and high sensitization can be realized, and the fabricating costs at the time of modularization of the APD can be greatly decreased.

First, the point of interest of the present invention will be described.

As described above, in a sequential mesa type APD in which the pn junction is formed by only an epitaxial growth process, it is difficult to concentrate, at the central portion of the mesa, the in-surface distribution of the electric field intensity in a surface parallel to the semiconductor substrate.

Therefore, conventionally, regardless of the fact that there is the difficulty that the manufacturing process (process steps) is complicated, the sequential mesa type APD, in which the pn junction is formed by using the Zn diffusion process which can make the distribution of the electric field concentrate at the central portion of the mesa by selectively diffusing the Zn at a specific portion in a surface parallel to the semiconductor substrate, is exclusively used.

The present inventor has used in combination contrivances for concentrating the distribution of the electric field at the central portion of the mesa which has not been carried out in the prior art, in a sequential mesa type APD in which positive holes or electrons are used as the main carrier and the pn junction is formed by only an epitaxial growth process.

From the concept opposite that of a sequential mesa type APD in which the pn junction is formed by using the conventional Zn diffusion process, the present inventor, as a result of diligently searching for such contrivances, has found that it suffices that the carrier density of a semiconductor layer which is near to the semiconductor substrate among a pair of semiconductor layers forming the pn junction is larger than the carrier density of a semiconductor layer which is far from the semiconductor substrate among the pair of semiconductor layers.

In a sequential mesa type APD structured by satisfying such a relationship, as described above, the ratio of the cross-sectional areas of the pair of semiconductor layers structuring the pn junction formed within the mesa portion is constant at the central portion of the mesa, and is different at the central portion of the mesa and at the peripheral portion of the mesa.

Here, considering from the standpoint of depleting the pn junction portion, because the APD has a sequential mesa structure, among the pair of semiconductor layers structuring the pn junction, at the vicinity of the periphery of the mesa, there is a state in which the carrier density of the semiconductor layer which is far from the semiconductor substrate is substantially weaker than at the central portion of the mesa.

In contrast, at the semiconductor layer which is near to the semiconductor substrate, conversely, there is a state in which the carrier density is high. However, because the carrier density is originally high at the semiconductor layer which is near to the semiconductor substrate, even if it is in a state in which the carrier density is substantially high, the effect is small.

Namely, the way of broadening (width) of the depletion region at the peripheral portion of the mesa is greater than the way of broadening (width) of the depletion region at the central portion of the mesa, and the electric field intensity at the central portion of the mesa is greater than the electric field intensity at the peripheral portion of the mesa.

Thus, in such a sequential mesa type APD according to the present invention, the component at the central portion of the mesa contained in the overall light-receiving characteristic of the APD can be increased, and the component at the peripheral portion of the mesa can be decreased.

Accordingly, in such a sequential mesa type APD according to the present invention, the effects of the dark current and noise caused due to crystal defects which are many at the peripheral portion of the mesa can be kept to a minimum, and decreasing of dark current, decreasing of noise, and high sensitization in the overall light-receiving characteristic of the APD can be attempted. Further, since the yield of modularizing is improved by making the alignment of the optical axes at the time of modularizing be easy and exact, the fabricating costs of modularizing can be greatly decreased.

In such a sequential mesa type APD, the relationship of the magnitude of the carrier densities of the pair of semiconductor layers forming the pn junction is a relationship opposite to the relationship of the magnitude of the carrier densities of the pair of semiconductor layers forming the pn junction in a conventional sequential mesa type APD in which the pn junction is formed by a Zn diffusion process.

Next, the background of the difficulty of the idea of the relationship of the magnitude of the carrier densities of the pair of semiconductor layers forming the pn junction will be described.

Namely, in a conventional sequential mesa type APD in which the pn junction is formed by using a Zn diffusion process, as described above, the pn junction is formed by the p-type contact layer 6b, in which the p-type carrier density is made high by Zn diffusion, and the n-type multiplying layer 5a.

At this time, it is preferable, for the contact layer 6b as well, that the p-type carrier density of the contact layer 6b is set to be as high as possible, for example, about $5 \times 10^{18}$ ($cm^{-3}$) or more. The gas pressure of the inert gas atmosphere used for carrying out sufficient Zn diffusion is controlled so as to maintain a relatively high value by using an exclusively-used controller.

Namely, in the conventional sequential mesa type APD in which the pn junction is formed by using a Zn diffusion process, there is a relationship in which the carrier density of the p-type contact layer 6b (the semiconductor layer which is far from the semiconductor substrate) forming the pn junction is larger than the carrier density of the n-type multiplying layer 5a (the semiconductor layer which is near to the semiconductor substrate).

Accordingly, in the sequential mesa type APD of the present invention, whose relationship is opposite to this relationship and in which the pn junction is formed by epitaxial growth, it would not be generally thought to make the carrier density of the semiconductor layer which is near to the semiconductor substrate among the pair of semiconductor layers forming the pn junction, larger than the carrier density of the semiconductor layer which is far from the semiconductor substrate among the aforementioned pair of semiconductor layers.

Further, in the sequential mesa type APD of the present invention in which the pn junction is formed by epitaxial growth, the semiconductor layer which is far from the semiconductor substrate among the pair of semiconductor layers forming the pn junction, is formed separate from and at the lower layer of the p-type contact layer, and the gas pressure of the inert gas atmosphere used for Zn diffusion for obtaining an ohmic electrode of the contact layer 6b may be maintained at a relatively low value.

Accordingly, in accordance therewith, in the sequential mesa type APD of the present invention in which the pn junction is formed by epitaxial growth, it would not be generally thought to make the carrier density of the semiconductor layer which is near to the semiconductor substrate among the pair of semiconductor layers forming the pn junction, larger than the carrier density of the semiconductor layer which is far from the semiconductor substrate among the aforementioned pair of semiconductor layers.

In order to achieve the above object, there is provided a sequential mesa type avalanche photodiode comprising:

a semiconductor substrate; and a sequential mesa portion formed on the semiconductor substrate, a plurality of semiconductor layers which include a light absorbing layer and a multiplying layer being laminated by epitaxial growth, in the sequential mesa portion, and a pair of semiconductor layers which form a pn junction being included in the plurality of semiconductor layers, wherein the carrier density of a semiconductor layer which is near to the semiconductor substrate among the pair of semiconductor layers is larger than the carrier density of a semiconductor layer which is far from the semiconductor substrate among the pair of semiconductor layers, and in accordance therewith, in the sequential mesa type avalanche photodiode, light-receiving current based on movement of electrons and positive holes generated in the sequential mesa portion when light is incident from the semiconductor substrate toward the light absorbing layer is larger at a central portion than at a peripheral portion of the sequential mesa portion.

According to a second aspect of the present invention, there is provided a sequential mesa type avalanche photodiode according to the first aspect, wherein the semiconductor substrate is structured from an n-type semiconductor substrate, and any of the electrons or the positive holes are the main carrier.

According to a third aspect of the present invention, there is provided a sequential mesa type avalanche photodiode according to the second aspect, wherein the n-type semiconductor substrate is a semiconductor substrate formed from $n^+$-type InP.

According to a fourth aspect of the present invention, there is provided a sequential mesa type avalanche photodiode according to the second aspect, wherein the semiconductor layer which is near to the n-type semiconductor substrate among the pair of semiconductor layers is an n-type semiconductor layer, and the semiconductor layer which is far from the n-type semiconductor substrate among the pair of semiconductor layers is a p-type semiconductor layer.

According to a fifth aspect of the present invention, there is provided a sequential mesa type avalanche photodiode according to the fourth aspect, wherein the n-type semiconductor layer (4a, 14a, 15a) is an n-type electric field relaxation layer (4a), and the p-type semiconductor layer (5b, 14b, 12b) is a p-type multiplying layer (5b), and the positive holes are the main carrier.

According to a sixth aspect of the present invention, there is provided a sequential mesa type avalanche photodiode according to the fifth aspect, wherein the n-type electric field relaxation layer is an electric field relaxation layer formed from $n^+$-type InP, and the p-type multiplying layer is a multiplying layer formed from $p^-$-type InP.

According to a seventh aspect of the present invention, there is provided a sequential mesa type avalanche photodiode according to the fourth aspect, wherein the n-type semiconductor layer is an n-type electric field relaxation layer, and the p-type semiconductor layer is a p-type electric field concentration layer, and the positive holes are the main carrier.

According to an eighth aspect of the present invention, there is provided a sequential mesa type avalanche photodiode according to the seventh aspect, wherein the n-type electric field relaxation layer is an electric field relaxation layer formed from $n^+$-type InP, and the p-type electric field concentration layer is a electric field concentration layer formed from $p^-$-type InP.

According to a ninth aspect of the present invention, there is provided a sequential mesa type avalanche photodiode according to the fourth aspect, wherein the n-type semiconductor layer is an n-type multiplying layer, and the p-type semiconductor layer is a $p^-$-type electric field concentration layer, and the electrons are the main carrier.

According to a tenth aspect of the present invention, there is provided a sequential mesa type avalanche photodiode according to the ninth aspect, wherein the n-type multiplying layer is a multiplying layer formed from n type InP, and the p-type electric field concentration layer is an electric field concentration layer formed from $p^-$-type InP.

According to an eleventh aspect of the present invention, there is provided a sequential mesa type avalanche photodiode according to the fourth aspect, wherein the n-type semiconductor layer is an n-type electric field concentration layer, and the p-type semiconductor layer is a p-type electric field concentration layer, and the electrons are the main carrier.

According to a twelfth aspect of the present invention, there is provided a sequential mesa type avalanche photodiode according to the eleventh aspect, wherein the n-type electric field concentration layer is a first electric field concentration layer formed from $n^+$-type InP, and the p-type electric field concentration layer is a second electric field concentration layer formed from $p^-$-type InP.

According to a thirteenth aspect of the present invention, there is provided a sequential mesa type avalanche photodiode according to the first aspect, wherein the semiconductor substrate is formed from a p-type semiconductor substrate, and any of the electrons and the positive holes are the main carrier.

According to a fourteenth aspect of the present invention, there is provided a sequential mesa type avalanche photodiode according to the thirteenth aspect, wherein the p-type semiconductor substrate is a semiconductor substrate formed from $p^+$-type InP.

According to a fifteenth aspect of the present invention, there is provided a sequential mesa type avalanche photodiode according to the thirteenth aspect, wherein a semiconductor layer which is near to the p-type semiconductor substrate among the pair of semiconductor layers is a p-type semiconductor layer, and a semiconductor layer which is far from the p-type semiconductor substrate among the pair of semiconductor layers is an n-type semiconductor layer.

According to a sixteenth aspect of the present invention, there is provided a sequential mesa type avalanche photodiode according to the fifteenth aspect, wherein the p-type semiconductor layer is a p-type contact layer, and the n-type semiconductor layer is an n-type multiplying layer, and the positive holes are the main carrier.

According to a seventeenth aspect of the present invention, there is provided a sequential mesa type avalanche photodiode according to the sixteenth aspect, wherein the p-type contact layer is a contact layer formed from $p^+$-type InGaAs, and the n-type multiplying layer is a multiplying layer formed from $n^-$-type InP.

According to an eighteenth aspect of the present invention, there is provided a sequential mesa type avalanche photodiode according to the fifteenth aspect, wherein the p-type semiconductor layer is a p-type electric field relaxation layer, and the n-type semiconductor layer is an n-type multiplying layer, and the electrons are the main carrier.

According to a nineteenth aspect of the present invention, there is provided a sequential mesa type avalanche photodiode according to the eighteenth aspect, wherein the p-type electric field relaxation layer is an electric field relaxation layer formed from $p^+$-type InP, and the n-type multiplying layer is a multiplying layer formed from $n^-$-type InP.

In order achieve the above object, according to a twentieth aspect of the present invention, there is provided a method of manufacturing a sequential mesa type avalanche photodiode, comprising the steps of:

preparing a semiconductor substrate;

laminating a plurality of semiconductor layers, including a light absorbing layer and a multiplying layer, on the semiconductor substrate by epitaxial growth, a pair of semiconductor layers which form a pn junction being included in the plurality of semiconductor layers; and forming a sequential mesa portion having a sequential mesa portion structure including therein the plurality of semiconductor layers, wherein the carrier density of a semiconductor layer which is near to the semiconductor substrate among the pair of semiconductor layers is larger than the carrier density of a semiconductor layer which is far from the semiconductor substrate among the pair of semiconductor layers, and in accordance therewith, in the sequential mesa type avalanche photodiode, light-receiving current based on movement of electrons and positive holes generated in the sequential mesa portion when light is incident from the semiconductor substrate toward the light absorbing layer is larger at a central portion than at a peripheral portion of the sequential mesa portion.

According to a twenty-first aspect of the present invention, there is provided a method of manufacturing a sequential mesa type avalanche photodiode according to the twentieth aspect, wherein the semiconductor substrate is formed from an n-type semiconductor substrate, and any of the electrons or the positive holes are the main carrier.

According to a twenty-second aspect of the present invention, there is provided a method of manufacturing a sequential mesa type avalanche photodiode according to the twenty-first aspect, wherein the n-type semiconductor substrate is a semiconductor substrate formed from $n^+$-type InP.

According to a twenty-third aspect of the present invention, there is provided a method of manufacturing a sequential mesa type avalanche photodiode according to the twenty-first aspect, wherein the semiconductor layer which is near to the n-type semiconductor substrate among the pair of semiconductor layers is formed from an n-type semiconductor layer, and the semiconductor layer which is far from the n-type semiconductor substrate among the pair of semiconductor layers is formed from a p-type semiconductor layer.

According to a twenty-fourth aspect of the present invention, there is provided a method of manufacturing a sequential mesa type avalanche photodiode according to the twenty-third aspect, wherein the n-type semiconductor layer is formed from an n-type electric field relaxation layer, and the p-type semiconductor layer is formed from a p-type multiplying layer, and the positive holes are the main carrier.

According to a twenty-fifth aspect of the present invention, there is provided a method of manufacturing a sequential mesa type avalanche photodiode according to the twenty-fourth aspect, wherein the n-type electric field relaxation layer is an electric field relaxation layer formed from $n^+$-type InP, and the p-type multiplying layer is a multiplying layer formed from $p^-$-type InP.

According to a twenty-sixth aspect of the present invention, there is provided a method of manufacturing a sequential mesa type avalanche photodiode according to the twenty-third aspect, wherein the n-type semiconductor layer is formed from an n-type electric field relaxation layer, and the p-type semiconductor layer is formed from a p-type electric field concentration layer, and the positive holes are the main carrier.

According to a twenty-seventh aspect of the present invention, there is provided a method of manufacturing a sequential mesa type avalanche photodiode according to the twenty-sixth aspect, wherein the n-type electric field relaxation layer is an electric field relaxation layer formed from $n^+$-type InP, and the p-type electric field concentration layer is an electric field concentration layer formed from $p^-$-type InP.

According to a twenty-eighth aspect of the present invention, there is provided a method of manufacturing a sequential mesa type avalanche photodiode according to the twenty-third aspect, wherein the n-type semiconductor layer is formed from an n-type multiplying layer, and the p-type semiconductor layer is formed from a p-type electric field concentration layer, and the electrons are the main carrier.

According to a twenty-ninth aspect of the present invention, there is provided a method of manufacturing a sequential mesa type avalanche photodiode according to the twenty-eighth aspect, wherein the n-type multiplying layer is a multiplying layer formed from n type InP, and the p-type electric field concentration layer is an electric field concentration layer formed from $p^-$-type InP.

According to a thirtieth aspect of the present invention, there is provided a method of manufacturing a sequential mesa type avalanche photodiode according to the twenty-third aspect, wherein the n-type semiconductor layer is formed from an n-type electric field concentration layer, and the p-type semiconductor layer is formed from a p-type electric field concentration layer, and the electrons are the main carrier.

According to a thirty-first aspect of the present invention, there is provided a method of manufacturing a sequential mesa type avalanche photodiode according to the thirtieth aspect, wherein the n-type electric field concentration layer is a first electric field concentration layer formed from $n^+$-type InP, and the p-type electric field concentration layer is a second electric field concentration layer formed from $p^-$-type InP.

According to a thirty-second aspect of the present invention, there is provided a method of manufacturing a sequential mesa type avalanche photodiode according to the twentieth aspect, wherein the semiconductor substrate is formed from a p-type semiconductor substrate, and any of the electrons and the positive holes are the main carrier.

According to a thirty-third aspect of the present invention, there is provided a method of manufacturing a sequential mesa type avalanche photodiode according to the thirty-second aspect, wherein the p-type semiconductor substrate (1$b$) is a semiconductor substrate formed from $p^+$-type InP.

According to a thirty-fourth aspect of the present invention, there is provided a method of manufacturing a sequential mesa type avalanche photodiode according to the thirty-second aspect, wherein a semiconductor layer which is near to the p-type semiconductor substrate among the pair of semiconductor layers is formed from a p-type semiconductor layer, and a semiconductor layer which is far from the p-type semiconductor substrate among the pair of semiconductor layers is formed from an n-type semiconductor layer.

According to a thirty-fifth aspect of the present invention, there is provided a method of manufacturing a sequential mesa type avalanche photodiode according to the thirty-fourth aspect, wherein the p-type semiconductor layer is formed from a p-type contact layer, and the n-type semiconductor layer is formed from an n-type multiplying layer, and the positive holes are the main carrier.

According to a thirty-sixth aspect of the present invention, there is provided a method of manufacturing a sequential mesa type avalanche photodiode according to the thirty-fifth aspect, wherein the p-type contact layer is a contact layer formed from $p^+$-type InGaAs, and the n-type multiplying layer is a multiplying layer formed from $n^-$-type InP.

According to a thirty-seventh aspect of the present invention, there is provided a method of manufacturing a sequential mesa type avalanche photodiode according to the thirty-fourth aspect, wherein the p-type semiconductor layer is formed from a p-type electric field relaxation layer, and the n-type semiconductor layer is formed from an n-type multiplying layer, and the electrons are the main carrier.

According to a thirty-eighth aspect of the present invention, there is provided a method of manufacturing a sequential mesa type avalanche photodiode according to the thirty-seventh aspect, wherein the p-type electric field relaxation layer is an electric field relaxation layer formed from $p^+$-type InP, and the n-type multiplying layer is a multiplying layer formed from $n^-$-type InP.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiment of the invention, and together with the general description given above and the detailed description of the preferred embodiment given below, serve to explain the principles of the invention.

FIGS. 1A and 1B are a cross-sectional view and an external perspective view showing a schematic structure of a sequential mesa type avalanche photodiode according to a first embodiment of the present invention;

DETAILED DESCRIPTION OF THE INVENTION

Figure 2:
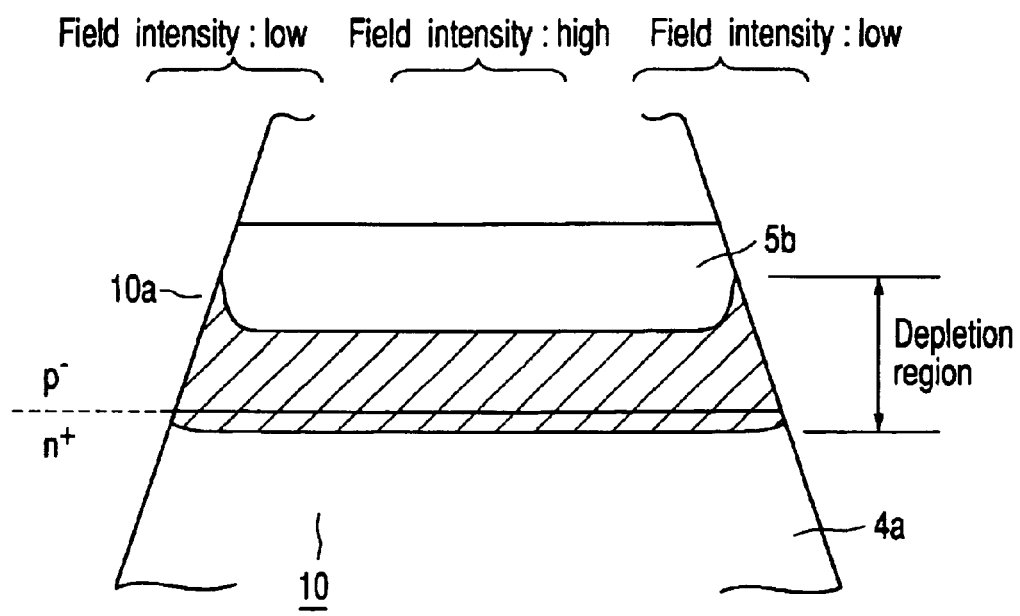
FIG. 2 is a view showing the way of broadening (width) of a depletion region by a built-in potential of the sequential mesa type avalanche photodiode according to the first embodiment.

Reference will now be made in detail to the presently preferred embodiments of the invention as illustrated in the accompanying drawings, in which like reference numerals designate like or corresponding parts.

Hereinafter, embodiments of the present invention will be described with reference to the figures.

FIRST EMBODIMENT

FIG. 1A is a cross-sectional view of a sequential mesa type avalanche photodiode (APD) according to a first embodiment of the present invention.

FIG. 1B is an external perspective view of the sequential mesa type APD according to the first embodiment of the present invention.

Figure 9A:
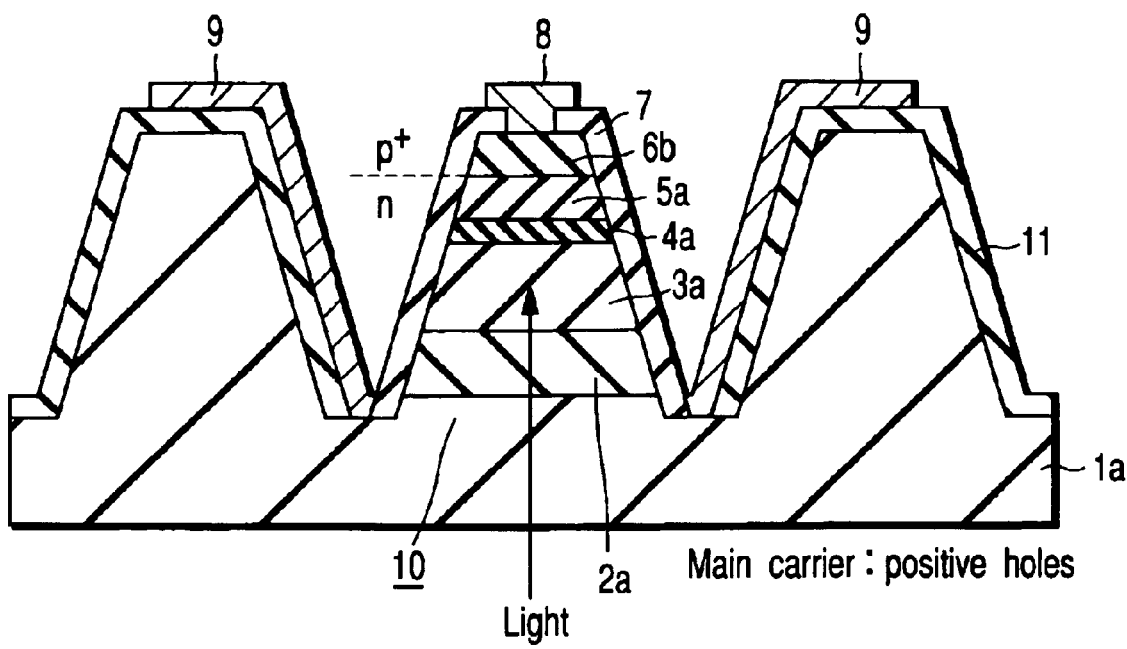
FIGS. 9A and 9B are a cross-sectional view and an external perspective view showing a schematic structure of the conventional sequential mesa type avalanche photodiode.
Figure 9B:
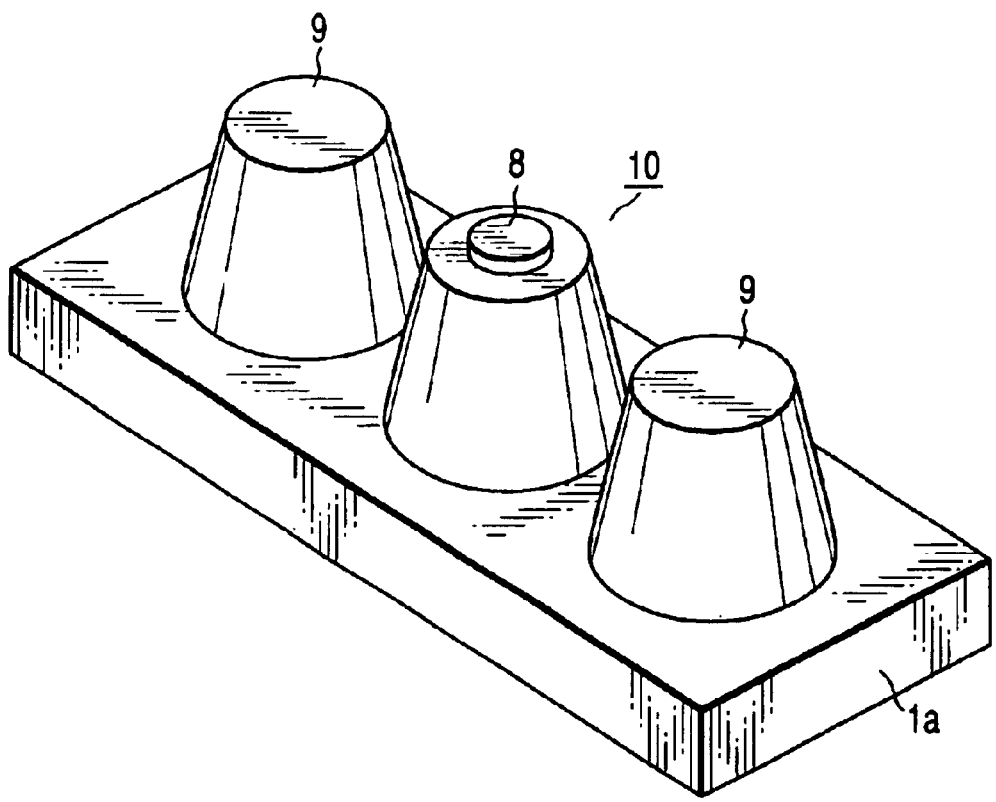

In FIGS. 1A and 1B, portions which are the same as those of the conventional sequential mesa type APD shown in FIGS. 9A and 9B are denoted by the same reference numerals, and detailed description of the repeated portions is omitted.

In the sequential mesa type APD of the first embodiment, a positive hole is used as the main carrier, and a pn junction is formed by epitaxial growth.

Namely, as shown in FIGS. 1A and 1B, in the sequential mesa type APD of the first embodiment, after a buffer layer $2a$ formed from $n^+$-type InP, a light absorbing layer $3a$ formed from $n^-$-type InGaAs, an electric field relaxation layer $4a$ formed from $n^+$-type InP, a multiplying layer $5b$ formed from $p^-$-type InP, and a contact layer $6b$ formed from $p^+$-type InGaAs are successively formed by epitaxial growth on a semiconductor substrate $1a$ formed from $n^+$-type InP by using the MOVPE (organometallic vapor phase epitaxial growth) method, for example, a conical sequential mesa portion 10 is formed by wet-etching from above.

After a protective layer 7 is coated on the sequential mesa portion 10, a p electrode 8 contacting the p-type contact layer $6b$ is formed.

Further, on the both sides of the sequential mesa portion 10, n electrodes 9 are attached, via the protective layer 11, to another mesa portion formed for attaching electrodes.

Accordingly, in the sequential mesa type APD of the first embodiment, the pn junction is formed by the electric field relaxation layer $4a$ formed from $n^+$-type InP and the multiplying layer $5b$ formed from $p^-$-type InP.

Further, the carrier density of the electric field relaxation layer $4a$, which is formed from $n^+$-type InP and which is near to the n-type semiconductor substrate $1a$, is set to, for example, $1\times10^{18}$ (cm$^{-3}$), which is larger than the carrier density, for example, $5\times10^{16}$ (cm$^{-3}$), of the p-type multiplying layer $5b$ far from the n-type semiconductor substrate $1a$.

In the sequential mesa type APD structured in this way, as shown by the arrow in FIG. 1A, light incident from the bottom surface of the semiconductor substrate $1a$ penetrates through the semiconductor substrate $1a$ and the buffer layer $2a$ and is absorbed at the light absorbing layer $3a$, thereby a pair of an electron and an positive hole is generated.

Among the pair of the electron and the positive hole generated in this way, the electron moves to the n electrode 9 via the n-type semiconductor substrate $1a$, and the positive hole is multiplied at the multiplying layer $5b$ and moves to the p electrode 8 via the contact layer $6b$.

Moreover, in the sequential mesa type APD of the first embodiment which is structured in this way, in the sequential mesa portion 10, as described above, the carrier density of the n-type electric field relaxation layer $4a$ near to the n-type semiconductor substrate $1a$ is set to, for example, $1\times10^{18}$ (cm$^{-3}$), which is larger than the carrier density, for example, $5\times10^{16}$ (cm$^{-3}$), of the p-type multiplying layer $5b$ far from the n-type semiconductor substrate $1a$.

Therefore, the in-surface distribution of field intensity in a surface parallel to the semiconductor substrate $1a$ concentrates at the central portion of the mesa.

Next, the reason why the in-plane distribution of the electric field intensity concentrates at the central portion of the mesa will be described.

FIG. 2 shows the way of broadening (width) of the depletion region (depletion layer) by built-in potential from the pn junction in the sequential mesa type APD of the first embodiment in which positive holes are used as the main carrier as shown in FIGS. 1A and 1B.

Note that, as described above, the ratio of the cross-sectional areas of the n-type electric field relaxation layer $4a$ and the p-type multiplying layer $5b$ forming the pn junction is constant at the central portion of the mesa. However, the ratio at the central portion of the mesa is different from that at the vicinity of the periphery of the mesa.

Here, considering from the standpoint of depleting the pn junction portion, because the APD has a sequential mesa structure, at the vicinity of the periphery of the mesa, there is a state in which the carrier density of the multiplying layer $5b$ is substantially weaker than at the central portion of the mesa.

In contrast, at the n-type electric field relaxation layer $4a$, conversely, there is a state in which the carrier density is high. However, because the carrier density is originally high at the n-type electric field relaxation layer $4a$, even if it is in a state in which the carrier density is substantially high, the effect is small.

Namely, as shown in FIG. 2, the way of broadening (width) of the depletion region at the peripheral portion of the mesa is larger than the way of broadening (width) of the depletion region at the central portion of the mesa. Thus, the electric field intensity at the central portion of the mesa is higher than the electric field intensity at the peripheral portion of the mesa.

Figure 3:
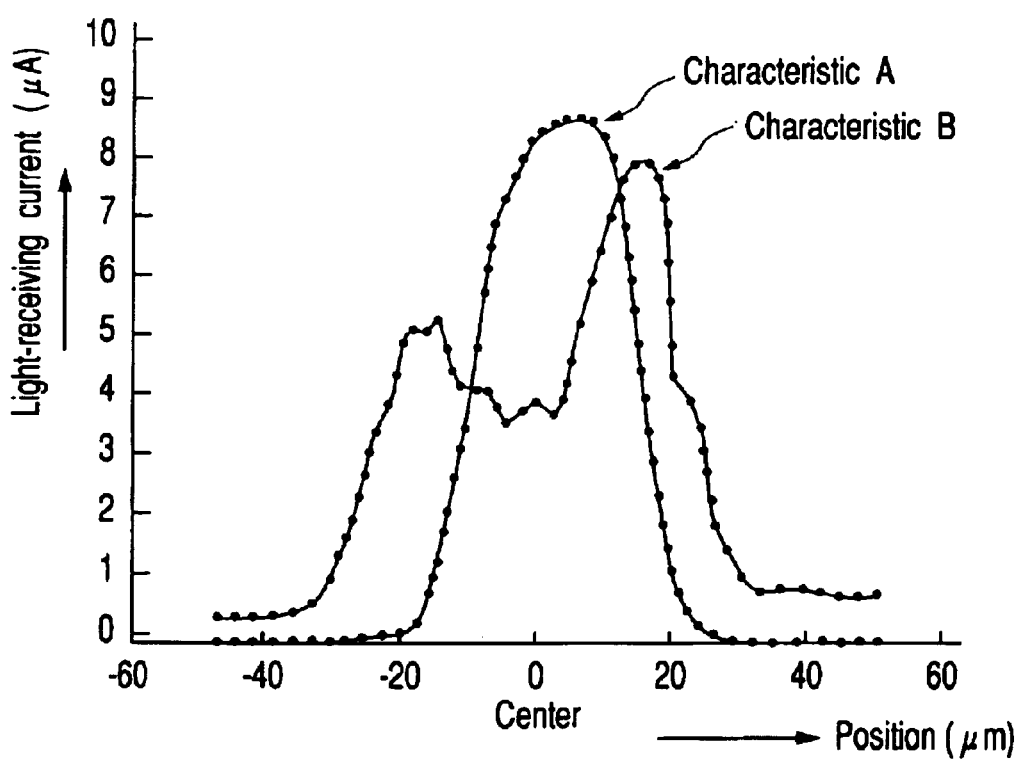
FIG. 3 is a graph showing light-receiving distribution characteristics of the sequential mesa type avalanche photodiode according to the first embodiment and a conventional avalanche photodiode.

Characteristic A in FIG. 3 shows an actually-measured light-receiving sensitivity distribution characteristic of the sequential mesa type APD according to the first embodiment.

Note that the light-receiving diameter of the sequential mesa type APD of the first embodiment is 30 μm.

As can be understood from the actually-measured characteristic A, the sequential mesa type APD of the first embodiment has a single-peaked characteristic in which the light-receiving current at the central portion of the mesa is larger than the light-receiving current at the peripheral portion of the mesa.

In the sequential mesa type APD whose light-receiving characteristic is a single-peaked characteristic, as described later, alignment of the optical axes is easy when the APD is modularized and used in actuality, and alignment of the optical axes may be carried out at the central portion of the mesa at which the light-receiving current is larger than that of the peripheral portion of the mesa. Therefore, there are the advantages that a sufficient light-receiving characteristic can be exhibited, and high sensitization is realized by keeping to a minimum the effects of the dark current and noise contained in the light-receiving signal relating to the above-described problem of crystallinity.

Therefore, the component of the mesa central portion, which component is contained in the overall light-receiving characteristic of the sequential mesa type APD of the first embodiment, can be increased, and the component of the peripheral portion of the mesa can be decreased.

Accordingly, the sequential mesa type APD according to the first embodiment can keep to a minimum the effects of the dark current and noise caused due to crystal defects which are many at the peripheral portion of the mesa including a mesa side surface 10a, and decreasing of dark current, decreasing of noise, and high sensitization in the overall light-receiving characteristic of the sequential mesa type APD can be attempted.

SECOND EMBODIMENT

Figure 4:
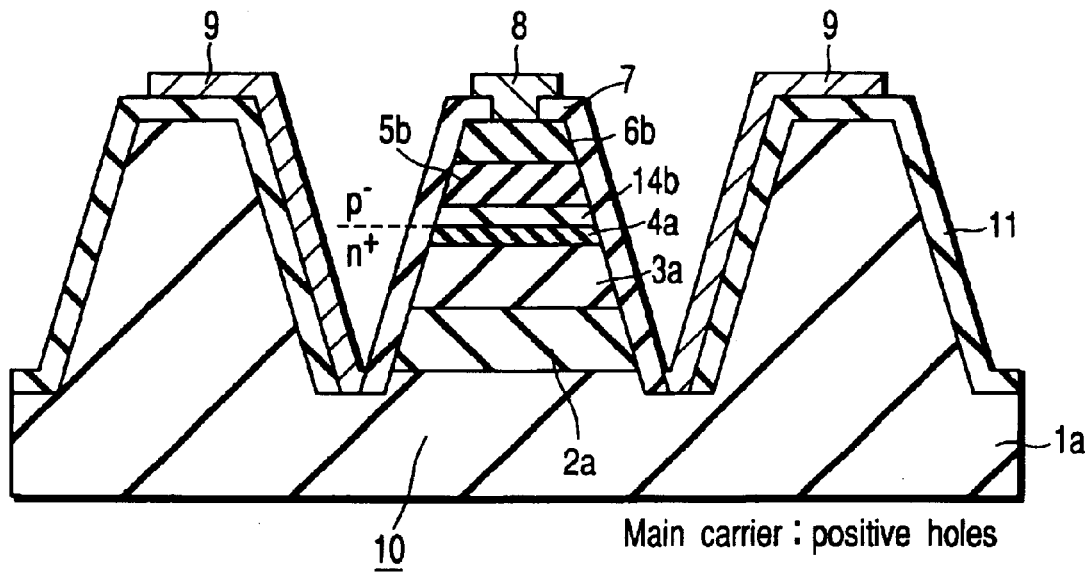
FIG. 4 is a cross-sectional view showing a schematic structure of a sequential mesa type avalanche photodiode according to a second embodiment of the present invention.

FIG. 4 is a cross-sectional view of a sequential mesa type avalanche photodiode (APD) according to a second embodiment of the present invention.

In FIG. 4, portions which are the same as those of the sequential mesa type APD as shown in FIG. 1A according to the first embodiment are denoted by the same reference numerals, and detailed description of the repeated portions is omitted.

In the sequential mesa type APD of the second embodiment, in the same way as in the above-described sequential mesa type APD of the first embodiment, positive holes are used as the main carrier, and the pn junction is formed by epitaxial growth.

Namely, as shown in FIG. 4, in the sequential mesa type APD of the second embodiment, an electric field concentration layer 14b, which is formed from p⁻-type InP and which is a layer for concentrating electric fields, is provided between the electric field relaxation layer 4a formed from n⁺-type InP and the multiplying layer 5b formed from p⁻-type InP in the sequential mesa portion 10.

Further, the pn junction is formed by the electric field relaxation layer 4a formed from n⁺-type InP and the electric field concentration layer 14b formed from p⁻-type InP.

In the sequential mesa type APD of the second embodiment as well, with respect to the relationship of the magnitude of the carrier densities of the n-type electric field relaxation layer 4a and the p-type electric field concentration layer 14b, the carrier density of the n-type electric field relaxation layer 4a which is near to the semiconductor substrate 1a is set to, for example, $1 \times 10^{18}$ (cm⁻³), which is larger than the carrier density, for example, $5 \times 10^{16}$ (cm⁻³), of the p-type electric field concentration layer 14b which is far from the semiconductor substrate 1a.

Therefore, in the sequential mesa type APD of the second embodiment, the distribution of the electric field intensity within the mesa surface concentrates at the central portion of the mesa.

Accordingly, in the sequential mesa type APD of the second embodiment as well, substantially the same effects as those of the sequential mesa type APD of the previously-described first embodiment can be obtained.

Note that, in the sequential mesa type APD of the second embodiment, with respect to the relationship of the magnitude of the carrier densities of the electric field concentration layer 14b formed from p⁻-type InP and the multiplying layer 5b formed from p-type InP, the setting of these carrier densities can be arbitrarily carried out regardless of the convergence of electric fields.

Therefore, in the sequential mesa type APD of the second embodiment, there is no problem even if the multiplying layer 5b formed from InP is p⁺-type.

THIRD EMBODIMENT

Figure 5:
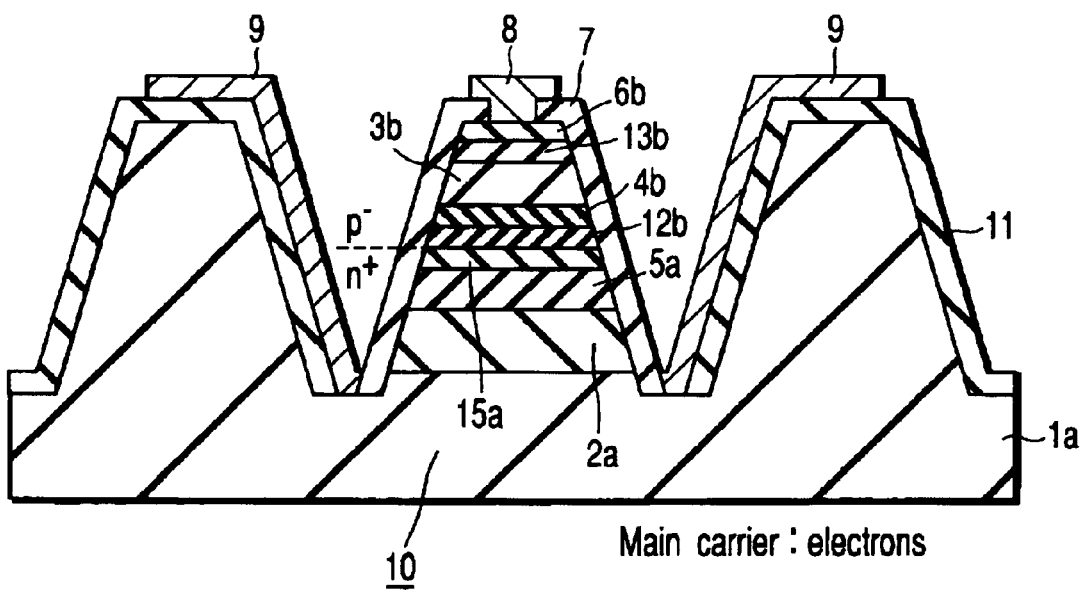
FIG. 5 is a cross-sectional view showing a schematic structure of a sequential mesa type avalanche photodiode according to a third embodiment of the present invention.

FIG. 5 is a cross-sectional view of a sequential mesa type avalanche photodiode (APD) according to a third embodiment of the present invention.

Figure 10:
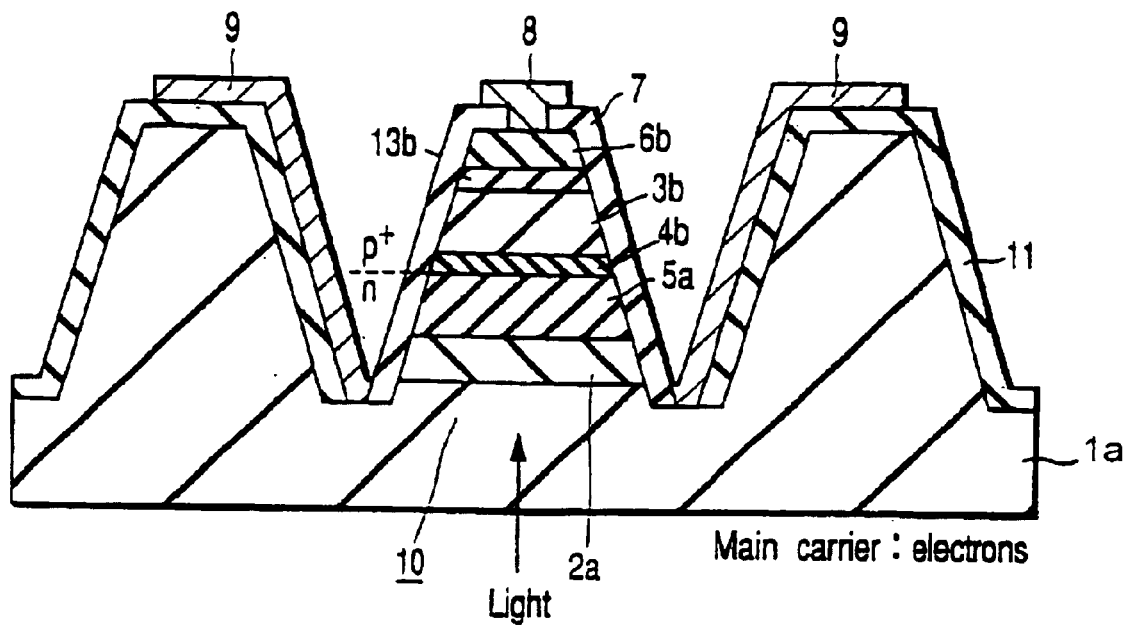
FIG. 10 is a cross-sectional view showing a schematic structure of another conventional sequential mesa type avalanche photodiode.
Figure 11:
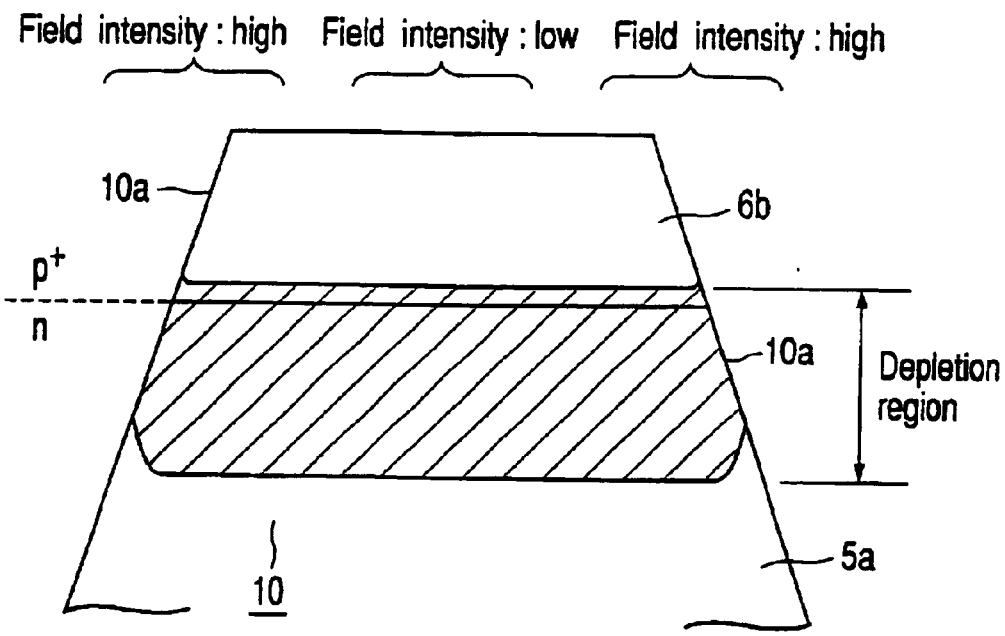
FIG. 11 is a view showing the way of broadening (width) of a depletion region by a built-in potential of the conventional sequential mesa type avalanche photodiode.

In FIG. 5, portions which are the same as those of the conventional sequential mesa type APD shown in FIG. 10 are denoted by the same reference numerals, and detailed description of the repeated portions is omitted.

In the sequential mesa type APD of the third embodiment, in the same way as in the conventional sequential mesa type APD shown in FIG. 10, electrons are used as the main carrier, and the pn junction is formed by epitaxial growth.

Namely, as shown in FIG. 5, in the sequential mesa type APD of the third embodiment, the buffer layer 2a formed from n⁺-type InP, the multiplying layer 5a formed from n⁻-type InP, a first electric field concentration layer 15a formed from n⁺-type InP, a second electric field concentration layer 12b formed from p⁻-type InP, the electric field relaxation layer 4b formed from p⁺-type InP, a light absorbing layer 3b formed from p⁻-type InGaAs, a window layer 13b formed from p-type InP, and the contact layer 6b formed from p⁺-type InGaAs are successively formed by epitaxial growth on the semiconductor substrate 1a formed from n⁺-type InP by using the above-described MBE (molecular beam epitaxy) method. Therefore, the sequential mesa portion 10 is formed by wet-etching.

After the protective layer 7 is coated on the sequential mesa portion 10, the p electrode 8 contacting the p-type contact layer 6b is formed.

Further, on the both sides of the sequential mesa portion 10, the n electrodes 9 are attached, via the protective layer 11, to another mesa portion formed for attaching electrodes.

Accordingly, in the sequential mesa type APD of the third embodiment, the pn junction is formed between the first electric field concentration layer 15a formed from n⁺-type InP and the second electric field concentration layer 12b formed from p⁻-type InP.

Further, in the sequential mesa type APD of the third embodiment as well, the carrier density of the first electric field concentration layer 15a which is formed from n⁺-type InP which is near to the n-type semiconductor substrate 1a is set to, for example, $1 \times 10^{18}$ (cm⁻³), which is larger than the carrier density, for example, $5 \times 10^{16}$ (cm⁻³), of the second electric field concentration layer 12b which is formed from p-type InP and which is far from the n-type semiconductor substrate 1a.

Therefore, in the sequential mesa type APD of the third embodiment, the distribution of the electric field intensity in the mesa surface concentrates at the central portion of the mesa.

Accordingly, in the sequential mesa type APD of the third embodiment as well, substantially the same effects as in the respective sequential mesa type APDs of the first and second embodiments can be obtained.

FOURTH EMBODIMENT

Figure 6:
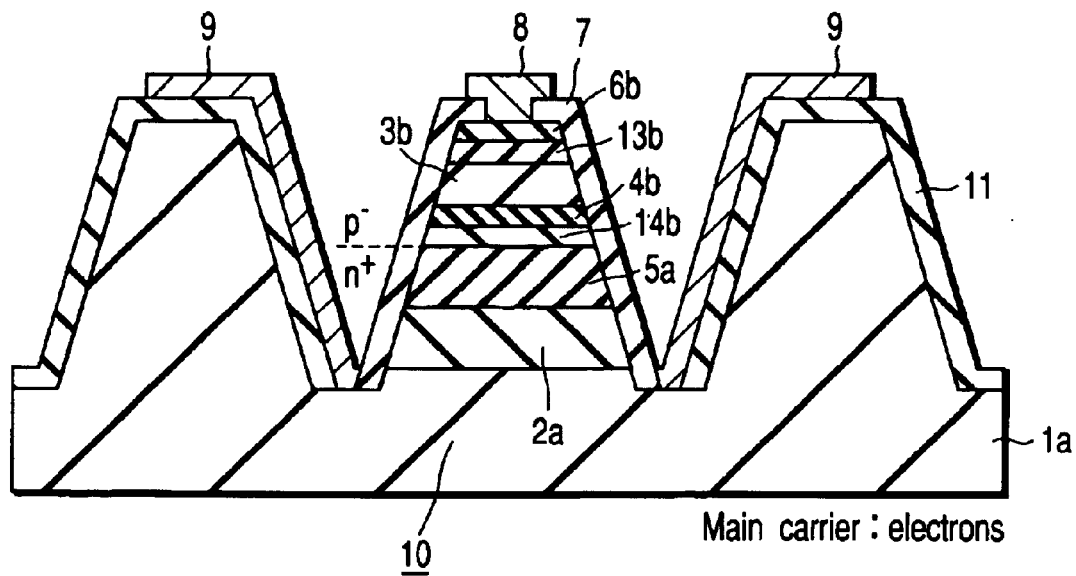
FIG. 6 is a cross-sectional view showing a schematic structure of a sequential mesa type avalanche photodiode according to a fourth embodiment of the present invention.

FIG. 6 is a cross-sectional view of a sequential mesa type avalanche photodiode (APD) according to a fourth embodiment of the present invention.

In FIG. 6, portions which are the same as those of the conventional sequential mesa type APD shown in FIG. 10 are denoted by the same reference numerals, and detailed description of the repeated portions is omitted.

In the sequential mesa type APD of the fourth embodiment, in the same way as in the conventional sequential mesa type APD shown in FIG. 10, electrons are used as the main carrier, and the pn junction is formed by epitaxial growth.

Namely, as shown in FIG. 6, in the sequential mesa type APD of the fourth embodiment, the buffer layer 2a formed from n⁺-type InP, the multiplying layer 5a formed from n⁺-type InP, the electric field concentration layer 14b formed from p⁻-type InP, the electric field relaxation layer 4b formed from p⁺-type InP, the light absorbing layer 3b formed from p⁻-type InGaAs, the window layer 13b formed from p-type InP, and the contact layer 6b formed from p⁺-type InGaAs are successively formed by epitaxial growth on the semiconductor substrate 1a formed from n⁺-type InP by using the above-described MBE (molecular beam epitaxy) method. Therefore, the sequential mesa portion 10 is formed by wet-etching.

After the protective layer 7 is coated on the sequential mesa portion 10, the p electrode 8 contacting the p-type contact layer 6b is formed.

Further, on the both sides of the sequential mesa portion 10, the electrodes 9 are attached, via the protective layer 11, to another mesa portion formed for attaching electrodes.

Accordingly, in the sequential mesa type APD of the fourth embodiment, the pn junction is formed between the multiplying layer 5a formed from n⁺-type InP and the electric field concentration layer 14b formed from p⁻-type InP.

Further, in the sequential mesa type APD of the fourth embodiment as well, the carrier density of the multiplying layer 5a, which is formed from n⁺-type InP and which is near to the n-type semiconductor substrate 1a, is set to, for example, $5 \times 10^{17}$ (cm⁻³), which is larger than the carrier density, for example, $5 \times 10^{16}$ (cm⁻³), of the electric field concentration layer 14b which is formed from p⁻-type InP and which is far from the n-type semiconductor substrate 1a.

Therefore, in the sequential mesa type APD of the fourth embodiment, the distribution of the electric field intensity within the mesa surface concentrates at the central portion of the mesa.

Accordingly, in the sequential mesa type APD of the fourth embodiment as well, substantially the same effects as in the respective sequential mesa type APDs of the first, second, and third embodiments can be obtained.

FIFTH EMBODIMENT

Figure 7:
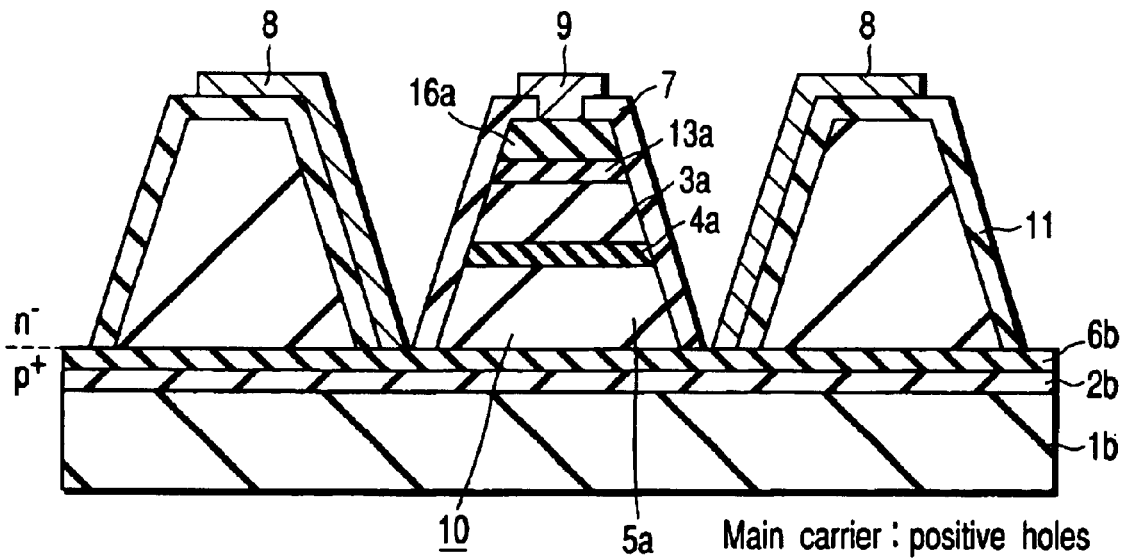
FIG. 7 is a cross-sectional view showing a schematic structure of a sequential mesa type avalanche photodiode according to a fifth embodiment of the present invention.

FIG. 7 is a cross-sectional view of a sequential mesa type avalanche photodiode (APD) according to a fifth embodiment of the present invention.

In FIG. 7, portions which are the same as those of the sequential mesa type APD shown in FIG. 10 and relating to the first embodiment are denoted by the same reference numerals, and detailed description of the repeated portions is omitted.

In the sequential mesa type APD of the fifth embodiment, the p-type semiconductor substrate 1b is used as the semiconductor substrate, positive holes are used as the main carrier, and the pn junction is formed by epitaxial growth.

Namely, as shown in FIG. 7, in the sequential mesa type APD of the fifth embodiment, the buffer layer 2a formed from p⁺-type InP, the contact layer 6b formed from p⁺-type InGaAs, the multiplying layer 5a formed from n⁻-type InP, the electric field relaxation layer 4a formed from n⁺-type InP, the light absorbing layer 3a formed from n⁻-type InGaAs, the window layer 13a formed from n⁺-type InP, and a contact layer 16a formed from n⁺-type InGaAs are successively formed by epitaxial growth on the semiconductor substrate 1b formed from p⁺-type InP by using the above-described MBE (molecular beam epitaxy) method. Thereafter, the sequential mesa portion 10 is formed by wet-etching.

After the protective layer 7 is coated on the sequential mesa portion 10, the n electrode 9 contacting the n type contact layer 16a is formed.

Further, on the both sides of the sequential mesa portion 10, the p electrodes 8 are attached, via the protective layer 11, to another mesa portion formed for attaching electrodes.

Accordingly, in the sequential mesa type APD of the fifth embodiment, the pn junction is formed by the contact layer 6b formed from p⁺-type InGaAs and the multiplying layer 5a formed from n⁻-type InP formed within the sequential mesa portion 10.

Further, in the sequential mesa type APD of the fifth embodiment, the carrier density of the contact layer 6b, which is formed from p⁺-type InGaAs and which is near to the p-type semiconductor substrate 1b, is set to, for example, $5 \times 10^{17}$ (cm⁻³), which is larger than the carrier density, for example, $5 \times 10^{16}$ (cm⁻³), of the multiplying layer 5a which is formed from n-type InP and which is far from the p-type semiconductor substrate 1b.

Therefore, in the sequential mesa type APD of the fifth embodiment, the distribution of the electric field intensity within the mesa surface concentrates at the central portion of the mesa.

Accordingly, in the sequential mesa type APD of the fifth embodiment as well, substantially the same effects as in the respective sequential mesa type APDs of the first through fourth embodiments can be obtained.

Note that, in the sequential mesa type APD of the fifth embodiment, it is possible to eliminate the contact layer 6b formed from p⁺-type InGaAs, and to form the p electrode 8 directly from the semiconductor substrate 1b formed from p⁺-type InP.

Further, in the sequential mesa type APD of the fifth embodiment, it is possible to eliminate the contact layer 16a formed from n+-type InGaAs, and to form the n electrode 9 directly from the window layer 13a formed from n+-type InP.

SIXTH EMBODIMENT

Figure 8:
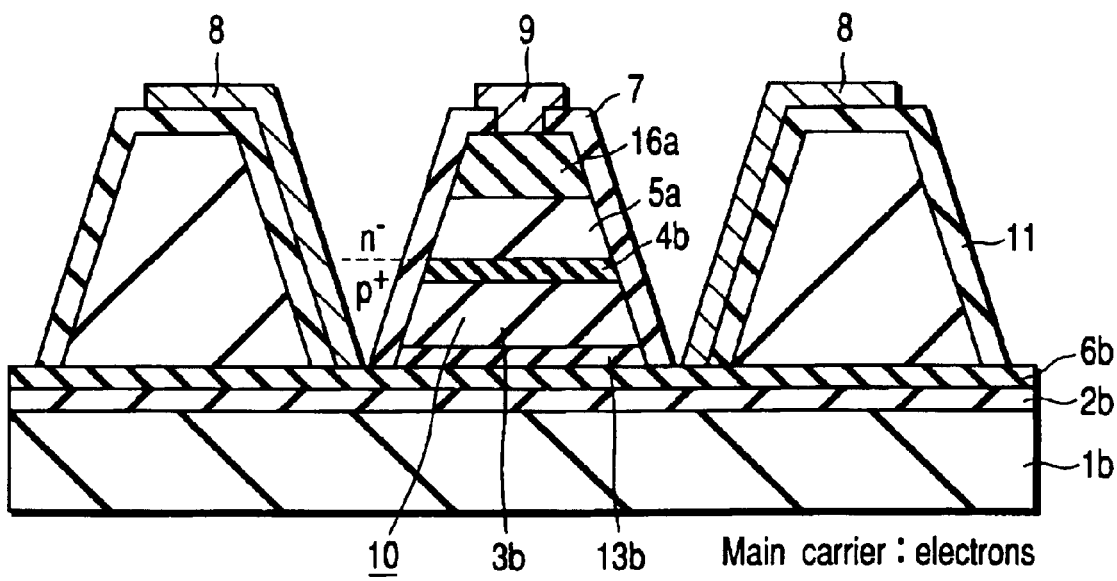
FIG. 8 is a cross-sectional view showing a schematic structure of a sequential mesa type avalanche photodiode according to a sixth embodiment of the present invention.
Figure 12:
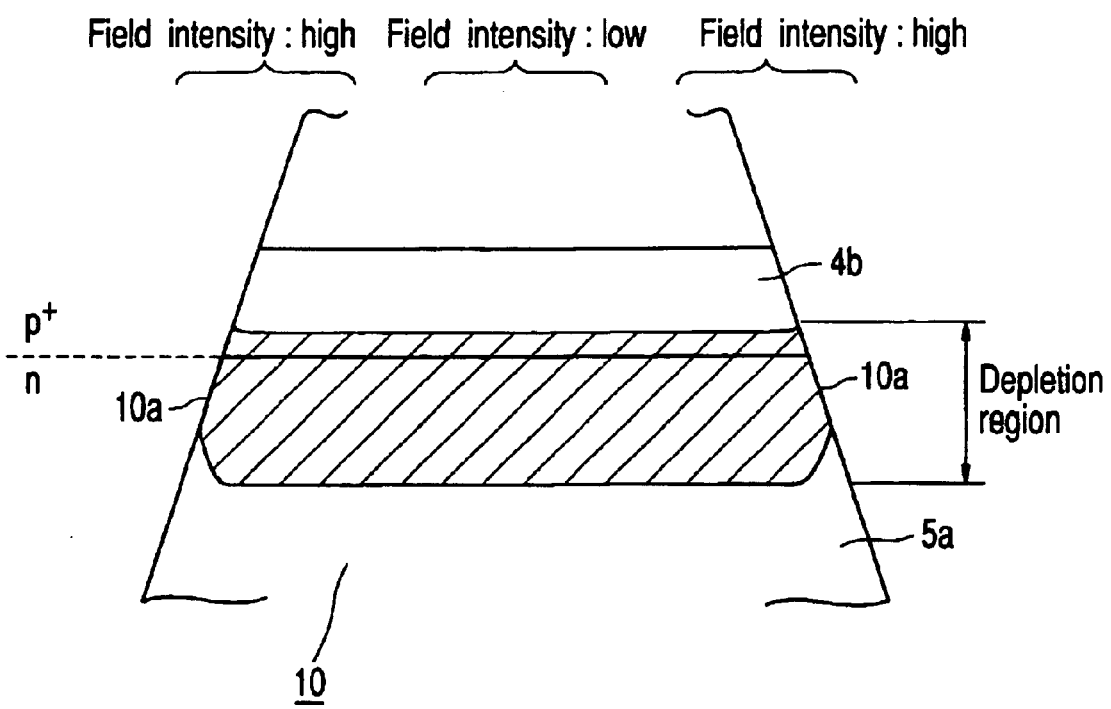
FIG. 12 is a view showing the way of broadening (width) of a depletion region by a built-in potential of the other sequential mesa type avalanche photodiode.

FIG. 8 is a cross-sectional view of a sequential mesa type avalanche photodiode (APD) according to a sixth embodiment of the present invention.

In FIG. 8, portions which are the same as those of the sequential mesa type APD shown in FIG. 7 and relating to the fifth embodiment are denoted by the same reference numerals, and detailed description of the repeated portions is omitted.

In the sequential mesa type APD of the sixth embodiment, the p-type semiconductor substrate 1b is used as a semiconductor substrate, and electrons are used as the main carrier, and the pn junction is formed by epitaxial growth.

Namely, as shown in FIG. 8, in the sequential mesa type APD of the sixth embodiment, the buffer layer 2b formed from p+-type InP, the contact layer 6b formed from p+-type InGaAs, the window layer 13b formed from p+-type InP, the light absorbing layer 3b formed from p−-type InGaAs, the electric field relaxation layer 4b formed from p+-type InP, the multiplying layer 5a formed from n−-type InP, and the contact layer 16a formed from n+-type InGaAs are successively formed by epitaxial growth on the semiconductor substrate 1b formed from p+-type InP, and thereafter, the sequential mesa portion 10 is formed by wet-etching.

After the protective layer 7 is coated on the sequential mesa portion 10, the n electrode 9 contacting the n-type contact layer 16a is formed.

On the both sides of the sequential mesa portion 10, the p electrodes 8 are attached, via the protective layer 11, to another mesa portion formed for attaching electrodes.

Further, in the sequential mesa type APD of the sixth embodiment, the pn junction is formed between the electric field relaxation layer 4b formed from p+-type InP and the multiplying layer 5a formed from n−-type InP, within the sequential mesa portion 10.

Moreover, the carrier density of the electric field relaxation layer 4b, which is formed from p+-type InP and which is near to the p-type semiconductor substrate 1b, is set to, for example, $5 \times 10^{17}$ (cm$^{-3}$), which is larger than the carrier density, for example, $5 \times 10^{16}$ (cm$^{-3}$), of the multiplying layer 5a which is formed from n−-type InP and which is far from the p-type semiconductor substrate 1b.

Therefore, in the sequential mesa type APD of the sixth embodiment, the distribution of the electric field intensity within the mesa surface concentrates at the central portion of the mesa.

Accordingly, in the sequential mesa type APD of the sixth embodiment as well, substantially the same effects as in the respective sequential mesa type APDs of the first through fifth embodiments can be obtained.

Note that, in the sequential mesa type APD of the sixth embodiment, it is possible to eliminate the contact layer 6b formed from p+-type InGaAs, and to form the p electrode 8 directly from the semiconductor substrate 1b formed from p+-type InP.

Further, it is possible to eliminate the contact layer 16a formed from n+-type InGaAs, and to form the n electrode 9 directly from the window layer 13a formed from n+-type InP.

As described above, in all of the first through sixth embodiments, it is important that, among a pair of semiconductor layers forming the pn junction formed by epitaxial growth in the sequential mesa portion 10 at the sequential mesa type APD, the carrier density of the semiconductor layer which is near to the semiconductor substrates 1a, 1b is larger than the carrier density of the semiconductor layer which is far from the semiconductor substrates 1a, 1b, and in accordance therewith, the distribution of the electric field intensity in a surface of the mesa concentrates at the central portion of the mesa.

Accordingly, in the present invention, except for the relationship of the magnitude of the carrier densities of the pair of semiconductor layers forming the pn junction of the sequential mesa type APD by epitaxial growth, any semiconductor layer structure can be arbitrarily set.

As described above, in the sequential mesa type avalanche photodiode of the present invention, the carrier density of a semiconductor layer which is near to the semiconductor substrate is larger than the carrier density of a semiconductor layer which is far from the semiconductor substrate in a pair of semiconductor layers structuring the pn junction formed by epitaxial growth in the sequential mesa portion of the avalanche photodiode. Therefore, the light-receiving current based on the movement of the electrons and the positive holes generated in the sequential mesa portion when light is incident from the aforementioned semiconductor substrate toward the aforementioned light absorbing layer, is larger at the peripheral portion of the aforementioned mesa portion than at the central portion.

Accordingly, in accordance with the sequential mesa type avalanche photodiode of the present invention, the distribution of the electric field intensity in a surface of the mesa concentrates at the central portion of the mesa. Therefore, the effects of the dark current and noise caused due to crystal defects which are many at the peripheral portion of the mesa including a mesa side surface can be kept to a minimum, and decreasing of dark current, decreasing of noise, and high sensitization in the overall light-receiving characteristic of the sequential mesa type avalanche photodiode can be attempted.

Further, because the electric field concentrates at the central portion of the mesa, the following great effects can be obtained with respect to the points of mounting/evaluation of the APD as well.

First, as shown by characteristic A in FIG. 3, because the APD according to the present invention has a single-peaked characteristic in which the light-receiving current at the central portion of the mesa is larger than the light-receiving current at the peripheral portion of the mesa, there is only one peak of the photoelectric current. Thus, the center-adjusting work (the above-described alignment of the optical axes), which sets a micromotion platform such that the light from a fiber is irradiated onto a light-receiving portion of the APD and the photoelectric current of the APD is made to be a maximum, can be easily carried out.

As a result, the time required for the center-adjusting work can be greatly shortened as compared with the APD according to the prior art in which a plurality of peaks of photoelectric current exist circumferentially as viewed from above the mesa. Therefore, making the work more efficient can be attempted.

Further, in the center-adjusting work according to the prior art, there is little photoelectric current at the central portion of the mesa at which the crystallinity is good and there is low noise, and the photoelectric current is large at the peripheral portion of the mesa at which the crystallinity deteriorates and there is much noise. Therefore, it is unclear at which portion of the mesa the sensitivity as a module on the communication measured after the APD is modularized, will be a maximum when the light is incident. However, in the APD according to the present invention, because the maximum photoelectric current can be obtained at the central portion of the mesa at which the crystallinity is good, at the time of carrying out the center-adjusting work, the alignment position at which the maximum sensitivity as a module on communication is obtained can be already known.

Namely, in the APD according to the prior art, it is easy for errors in the center-adjusting work, by which it is determined to be a defective good as a result after modularizing, to arise. However, in the APD according to the present invention, errors in the center-adjusting work discovered after modularizing do not arise, and yield is improved over the APD according to the prior art.

The improvement in the yield can resolve the uncertainty that modularizing progresses while it is unclear whether the item is a good item or a defective item which is the problem so far, and can greatly decrease the fabricating costs of modularizing an APD, because the work of modularizing the APD through many processes is made to be reliable.

As described above in detail, in accordance with the present invention, there is provided a sequential mesa type avalanche photodiode in which, in a sequential mesa type APD in which positive holes or electrons are used as the main carrier and a pn junction is formed by epitaxial growth, by making the distribution of the electric field concentrate at the central portion of the mesa, the effects of the dark current and noise contained in the light-receiving signal can be kept to a minimum, and high sensitization can be realized, and the fabricating costs at the time of modularization of the APD can be greatly decreased.

Further, in accordance with the present invention, there is provided a method of manufacturing a sequential mesa type avalanche photodiode in which, in a sequential mesa type APD in which positive holes or electrons are used as the main carrier and a pn junction is formed by epitaxial growth, by making the distribution of the electric field concentrate at the central portion of the mesa, the effects of the dark current and noise contained in the light-receiving signal can be kept to a minimum, and high sensitization can be realized, and the fabricating costs at the time of modularization of the APD can be greatly decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sequential mesa type avalanche photodiode comprising:

an n-type semiconductor substrate; and a sequential mesa portion formed on an upper part of the n-type semiconductor substrate, said sequential mesa portion comprising a plurality of semiconductor layers which include:
an n-type light absorbing layer,
an n-type electric field relaxation layer formed on an upper part of the n-type light absorbing layer, and
a p-type multiplying layer formed on the n-type electric field relaxation layer and laminated by epitaxial growth, wherein the p-type multiplying layer and the n-type electric field relaxation layer form a pn junction, wherein a carrier density of the n-type electric field relaxation layer is larger than a carrier density of the p-type multiplying layer, and wherein when light is incident from the n-type semiconductor substrate toward the n-type light absorbing layer, electrons and positive holes are generated in the sequential mesa portion and positive holes are a main carrier, and there is a single-peaked characteristic in which light-receiving current based on movement of the electrons and the positive holes is larger at a central portion of the sequential mesa portion than at a peripheral portion of the sequential mesa portion.

2. A sequential mesa type avalanche photodiode according to claim 1, wherein the plurality of semiconductor layers include an n-type buffer layer formed between the n-type semiconductor substrate and the n-type light absorbing layer.

3. A sequential mesa type avalanche photodiode according to claim 1, wherein the n-type light absorbing layer comprises an $n^-$-InGaAs.

4. A sequential mesa type avalanche photodiode according to claim 1, wherein the plurality of semiconductor layers include a p-type contact layer formed on the p-type multiplying layer.

5. A sequential mesa type avalanche photodiode according to claim 4, wherein the p-type contact layer comprises a $p^+$-type InGaAs.

6. A sequential mesa type avalanche photodiode according to claim 1, wherein the n-type semiconductor substrate comprises an $n^+$-type InP.

7. A sequential mesa type avalanche photodiode according to claim 6, wherein the n-type electric field relaxation layer comprises an $n^+$-type InP, and the p-type multiplying layer comprises a $p^{-type\ InP}$.

* * * * *